United States Patent
Shieh

(10) Patent No.: US 7,020,038 B2
(45) Date of Patent: Mar. 28, 2006

(54) EFFICIENT REFRESH OPERATION FOR SEMICONDUCTOR MEMORY DEVICES

(75) Inventor: Hau-Tai Shieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/839,048

(22) Filed: May 5, 2004

(65) Prior Publication Data
US 2005/0249009 A1 Nov. 10, 2005

(51) Int. Cl.
*G11C 7/00* (2006.01)
(52) U.S. Cl. .................. 365/222; 365/189.07; 365/236
(58) Field of Classification Search ................ 365/222, 365/149, 189.07, 236
See application file for complete search history.

(56) References Cited

U.S. PATENT DOCUMENTS

| 4,628,488 | A | * | 12/1986 | Saku et al. | .................. 365/222 |
| 6,094,705 | A | * | 7/2000 | Song | .......................... 365/222 |
| 6,178,479 | B1 | * | 1/2001 | Vishin | ........................ 365/222 |
| 6,490,216 | B1 | * | 12/2002 | Chen et al. | ................. 365/222 |
| 6,819,618 | B1 | * | 11/2004 | Kashiwazaki | ............... 365/222 |

* cited by examiner

*Primary Examiner*—Son Mai
(74) *Attorney, Agent, or Firm*—Duane Morris LLP

(57) ABSTRACT

A method and system are disclosed for refreshing a memory module. After identifying a beginning of a memory module for a refreshing operation, at least one address within the memory module being accessed is identified. When the refreshing operation approaches the identified accessed memory address, the refreshing operation is to be skipped, thereby skipping a predetermined number of clock cycles due to the skipped refreshing operation.

20 Claims, 4 Drawing Sheets

EFFICIENT REFRESH OPERATION FOR SEMICONDUCTOR MEMORY DEVICES

BACKGROUND

The present disclosure relates generally to semiconductor devices, and more particularly to semiconductor memory devices. Still more particularly, the present disclosure relates to the circuit and method that reduce power consumption of a semiconductor memory device. This modified refresh circuit and method would reduce the device power consumption, thereby improving both efficiency and stability in semiconductor memory devices.

The invention relates to a circuit for controlling information refreshing operations of the memory blocks in a semiconductor memory device, such as a dynamic random access memory (DRAM) device, and to a corresponding method in which a periodic sequence of control signals trigger the information refreshing operation of the DRAM semiconductor device memory blocks.

In DRAMs, it is necessary for the information stored in the memory cells to be periodically refreshed, since the memory cells can retain the information stored in them for only a limited time. Typically, DRAM memory cells use capacitors to store information. Since these capacitors discharge themselves after a specific time as a result of unavoidable internal quiescent currents, the stored charges of the capacitors have to be regularly renewed. The period of time in which the memory cells hold their stored charge is known as its data retention time. The memory cells are therefore recharged at fixed predetermined time intervals, so-called refresh cycles. The pulse for recharging, the so-called refresh pulse, can be generated internally within the module or else externally. In modern DRAMs, refresh cycles of at least 4096 refreshing operations per 64 ms (refresh rate 4K/64 ms) are customary.

The refresh cycle for the DRAM, i.e. the interval between the individual refresh pulses, must be chosen such that even the memory cell with the shortest retention time, which specifies how long the memory content can be retained in the associated cell, is refreshed again before information is permanently lost.

The conventional refresh method for DRAMs perform simultaneous refreshing operations on all memory blocks of the DRAM. This results in a high peak instantaneous current spike within the DRAM device. The current spike generates additional internal noise that can affect circuit operation and cause larger supply voltage fluctuations. In addition, since supply voltage power regulators must be designed to handle this peak current requirement, the overall memory design becomes not only less efficient but also more space-consuming.

Desirable in the art of semiconductor memory device designs are additional designs that may reduce the peak current during memory refresh while improving read/write performance and reducing power consumption.

SUMMARY

In view of the foregoing, this disclosure provides a circuit and method to reduce power consumption of a semiconductor memory device, thereby improving access performance and device stability.

In one example, a method and system are disclosed for refreshing a memory module. After identifying a beginning of a memory module for a refreshing operation, at least one address within the memory module being accessed is identified. When the refreshing operation approaches the identified accessed memory address, the refreshing operation is to be skipped, thereby skipping a predetermined number of clock cycles due to the skipped refreshing operation.

Although the invention is illustrated and described herein as embodied in a circuit and method for refreshing a memory module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION

In the present disclosure, one example of a circuit and method to reduce power consumption of a semiconductor memory device is disclosed.

Figure 1A:
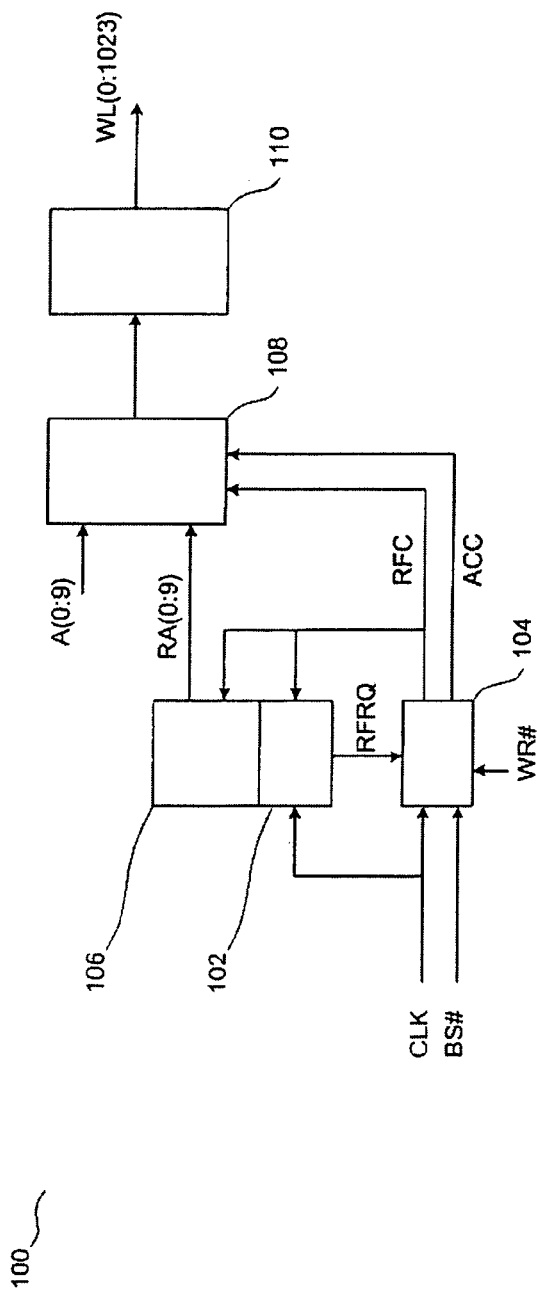
FIG. 1A illustrates a conventional DRAM refresh circuit.

FIG. 1A illustrates a conventional DRAM refresh circuit 100 containing 1024 word lines. In this diagram, a clock signal CLK is fed into a refresh control circuit 102 and an access control circuit 104 to provide address register synchronization with the DRAM device refreshing and access operations. A block select signal BS# and an access signal WR# are fed into the access control circuit 104 for memory block selection and access operation, respectively. It is understood that an access operation may refer to either a read or a write operation.

The refresh control circuit 102 generates a periodic refresh request signal RFRQ at the appropriate time for the refreshing operation as needed by the DRAM device. This refresh request RFRQ signal is routed to the access control circuit 104, which generates a refresh command signal RFC to control the sequence of the refreshing operation. The refresh command signal RFC is sent to the refresh control circuit 102 and a refresh address counter 106 to provide logic control of these circuits. The refresh address counter 106 always counts a refresh address RA (0:9) sequentially. RA (0:9) indicates a 10-bit refresh address for the 1024 word lines. The refresh command signal RFC is also sent to an address buffer 108, which transfers the current refresh address RA (0:9) to a word line decoder circuit 110 for selection of the desired word line to be refreshed. The word line refresh sequence is always scanned from word line 0 to word line 1023. The refresh command signal RFC is generated only during a refreshing operation, and is controlled by the access control circuit 104.

During an access operation, the access control circuit 104 generates an access control signal ACC. The access control signal ACC is routed to the address buffer 108, which transfers the desired access address A (0:9) to the word line decoder circuit 110 to select the desired word line WL (0:1023) to be read from or written to. A (0:9) indicates a 10-bit access address for the 1024 word lines. The access control signal ACC is generated only during an access operation as controlled by the access control circuit 104. Typically, the ACC signal allows a write operation when both signals BS# and WR# are low, and a read operation when signal BS# is low and signal WR# is high. During the normal operation of the DRAM refresh circuit 100, a word line may first be accessed for an access operation, thereby refreshing that word line. The same word line may then be selected again for a refresh due to the refreshing operation a few clock cycles later. This refresh repetition for the same word line within just a few clock cycles is unnecessary, and may not only decrease DRAM performance but also increase DRAM power consumption. Peak power consumption may be significantly increased if many memory blocks are simultaneously refreshed.

Figure 1B:
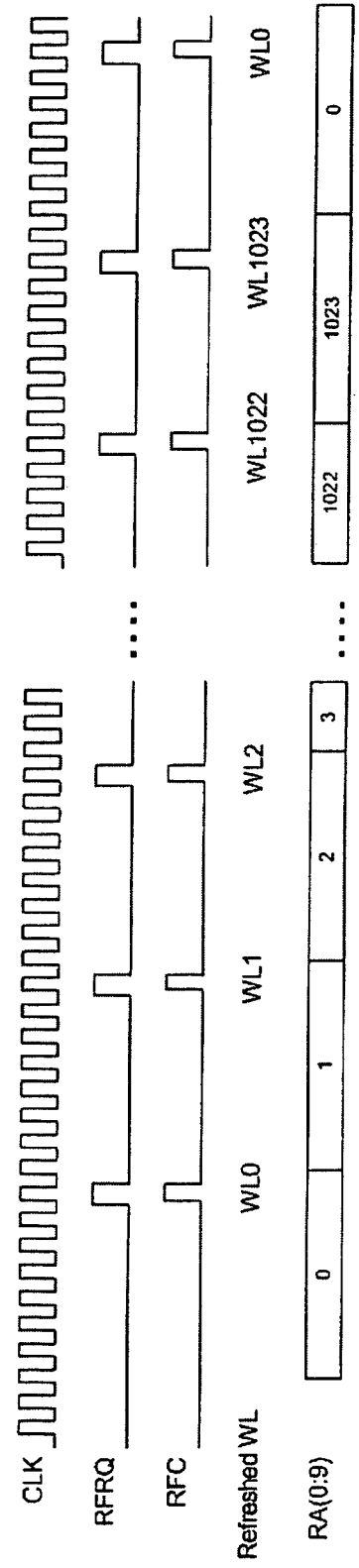
FIG. 1B illustrates a refresh sequence timing diagram for the conventional DRAM refresh circuit.

FIG. 1B illustrates a refresh sequence timing diagram 112 for the conventional DRAM refresh circuit 100. The clock signal CLK provides address-register synchronization with the refreshing and access operations of the associated DRAM device. The refresh control circuit 102 generates a periodic refresh request signal RFRQ at the appropriate time for the refreshing operation as needed by the DRAM device. This refresh request signal RFRQ is routed to the access control circuit 104, which generates the refresh command signal RFC to control the sequence of the refreshing operation. The refresh address counter 106 always counts a refresh address RA (0:9) sequentially from word line 0 to word line 1023. This is shown by the "refreshed WL" line in the timing diagram 112, which is controlled by the refresh addresses RA (0:9). This sequence of refresh cycles is fixed by the control circuitry and does not allow for reduction of unnecessary refresh cycles.

Figure 2:
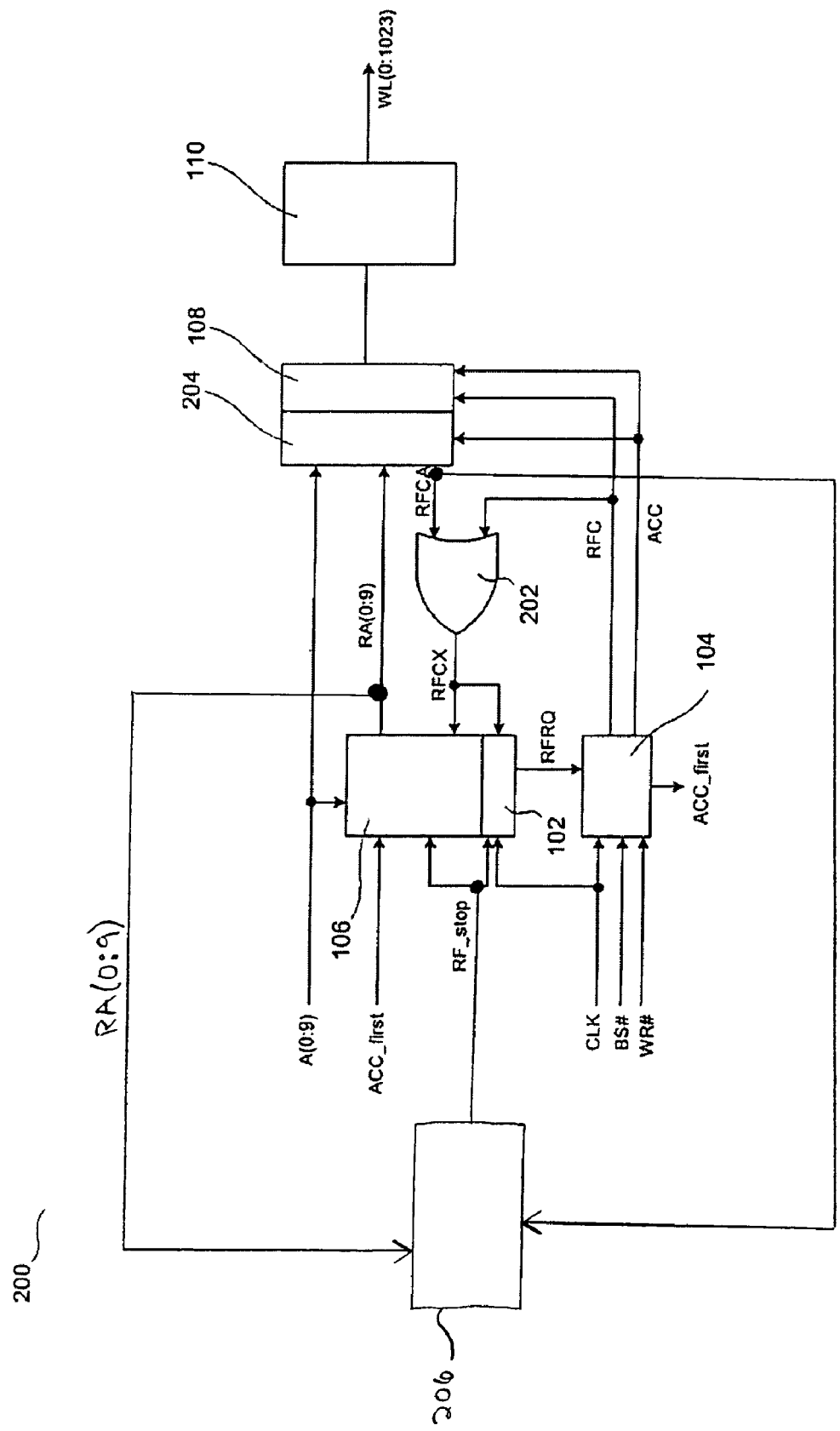
FIG. 2 illustrates a modified DRAM refresh circuit in accordance with one example of the present disclosure.

FIG. 2 illustrates a modified DRAM refresh circuit 200 containing 1024 word lines that will reduce the number of refreshing operations required by the DRAM in accordance with one example of the present disclosure. A clock signal CLK is fed into the refresh control circuit 102 and the access control circuit 104 to provide address-register synchronization with the refreshing and access operations of the DRAM device. The signals BS# and WR# are fed into the access control logic 104 for memory block selection and access operation, respectively. When the DRAM device is accessed for the first time, a signal ACC_first is generated by the access control circuit 104 on the first rising edge of the ACC signal. The signal ACC_first is then sent to the refresh address counter 106 to load the starting access address A (0:9) and to load the starting refresh address, which is A+1. In this example, A (0:9) represents the access address that selects the word lines to be accessed for an access operation, whereas RA (0:9) represents the refresh address that selects the word lines to be accessed for a refreshing operation. The word line access sequence and the refresh sequence are always scanned from word line 0 to word line 1023.

The refresh control circuit 102 generates the periodic refresh request signal RFRQ (RFRQ is high) at the appropriate time for the refreshing operation as needed by the DRAM device. This refresh request RFRQ signal is routed to the access control circuit 104, which generates the refresh command signal RFC to control the sequence of the refreshing operation. The access control circuit 104 also generates the access control signal ACC (ACC is high) to allow access to the selected memory cells for a read or write operation. The refresh request signal RFRQ would generate the refresh command signal RFC to execute refreshing operation when ACC is low. (It means no read or write operation). The memory would be idle without any operation when ACC is low and RFC is low too.

When the access control signal ACC is low, the refresh command signal RFC is sent to one input of the OR gate 202 and to the address buffer 108 to provide logic control of these circuits. The refresh command signal RFC sent to the address buffer 108 transfers the current refresh address RA (0:9) from an address comparator 204 to the word line decoder circuit 110 for the selection of the word line desired to be refreshed.

When access control signal ACC is high, a dummy refresh signal RFCA is enabled (RFCA is high) only if the current refresh address RA (0:9) is equivalent to the access address A (0:9). When the dummy refresh signal RFCA is enabled, the current refresh address is skipped, and the refresh address counter 106 is sequenced to the next refresh address. In other words, the dummy refresh signal RFCA indicates that, since the refresh address RA (0:9) has just been accessed (read from or written to), the data is up-to-date and needs not be refreshed.

During operation, since many addresses may be accessed, refreshing operations may be skipped for those addresses. Since the refresh cycle is determined by the period between two refreshing operations of a word line, the refresh cycle may be shortened if refreshing operations of various addresses are skipped. The shortened refresh cycle is undesirable and unnecessary for a particular DRAM device design. To ensure that the shortened refresh cycle is re-synchronized with the refresh cycle as predetermined by the DRAM device design, a refresh stop signal RF_stop is enabled at the end of a shortened refresh cycle. This refresh stop signal RF_stop ensures that a shortened refresh cycle is synchronized with the actual hardware refresh cycle.

Figure 3:
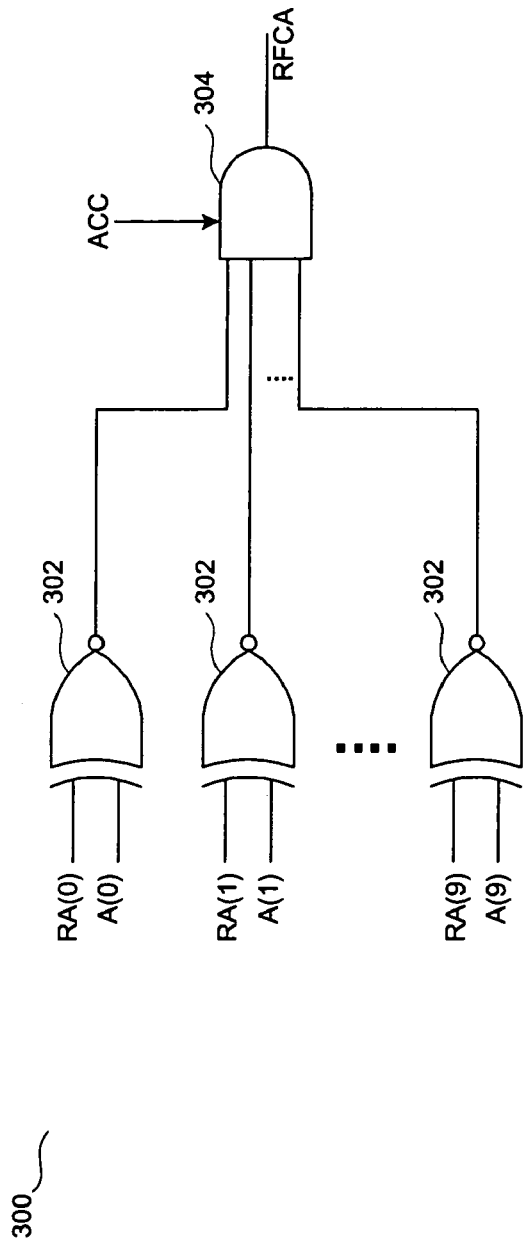
FIG. 3A illustrates an address comparator for the modified DRAM refresh circuit in accordance with one example of the present disclosure.
FIG. 3B illustrates a refresh sequence timing diagram for the address comparator for the modified DRAM refresh circuit in accordance with one example of the present disclosure.

FIG. 3A illustrates an address comparator 300 for the modified DRAM refresh circuit 200 in accordance with one example of the present disclosure. The address comparator 300, when activated by the access control signal ACC, determines when the access address lines are identical to the refresh lines. When the two lines are identical, a refreshing operation for that word line may not be needed. The address comparator 300 generates the dummy refresh signal RFCA during the access enable sequence (when ACC is high). Since this dummy refresh signal RFCA will not generate a refresh request RFRQ in the refresh control circuit 102, the refresh command signal RFC will not be generated in the access control circuit 104. Instead, the refresh address counter 106 will be incremented to the next refresh word line. This circuit includes ten identical exclusive NOR (XNOR) gates 302, all of whose outputs feed into an AND gate 304. The XNOR gates 302 provide a high output only when the access address A is identical to the refresh address RA. For example, if refresh address line RA (6) is low and the access address line A (6) is also low, the output of the XNOR gate 302 is set to high. By contrast, if the access address line A and the refresh address line RA are in opposite states, the output of the XNOR gate 302 is set to low. Only when all the AND gate 304 inputs are high and the access control signal ACC is high, will the AND gate 304 enable the high dummy refresh command signal RFCA (RFCA is high). During all other combinations of the AND gate 304 input signals, or if the access control signal ACC is low, the dummy refresh signal RFCA will remain low. Comparator 204 (FIG. 2) also serves as a temporary storage module for address A, allowing address A to be compared to address RA.

FIG. 3B illustrates a refresh sequence timing diagram 306 for the address comparator 300 for the modified DRAM refresh circuit 200 in accordance with one example of the present disclosure. Row 308 shows the refresh address lines RA (0) to RA (9) columns. Row 310 indicates when the DRAM access operation begins, at which time the signal ACC_first is set to high by the access control circuit 104 on the rising edge of the first ACC signal. In this example, the leading edge of the first access cycle occurs when A equals 0000101000. Therefore, row 310 represents the first RA address, which is A+1 or 0000101001. Row 312 indicates the normal refreshing operation by sequentially incrementing to the next RA address 0000101010. In this example, this process continues to 1111111111 (row 314) and then starts back at 000000000 and continues, to 0000100111 (row 316), where RA equals to A−1. Upon the next increment of the refresh address lines, when RA equals to A, or 0000101000 (row 318) the refresh stop signal RF_stop is set to high. The refresh stop signal RF_stop remains high until the shortened refresh cycle is re-synchronized with the refresh cycle as predetermined by the DRAM device design. The difference between the shortened refresh cycle and the DRAM device refresh cycle is tracked by a counter NR_counter. The counter NR_counter increments when a refreshing operation is skipped, while the NR_counter decrements when the refresh stop signal RF_stop is enabled. For example, if three refreshing operations are skipped while refreshing 1024 word lines, three periods of no refreshing operations are appended to the shortened refresh cycle to ensure that the shortened refresh cycle is re-synchronized with the DRAM device refresh cycle. During the three periods, no additional refreshing operations (i.e. refresh command signal RFC) will be generated until the counter NR_counter has counted down to 0 again, at which time the refresh stop signal RF_stop is disabled, thereby allowing the refresh cycles to begin once again. Counting module 206 is shown in FIG. 2 for incrementing NR-counter in response to dummy refresh command signal RFCA (i.e., for each skipped refresh operation). As set forth above, counting module 206 provides RF stop signal while NR counter decrements for blocking further refreshing operation until the skipped clock cycles have run. Counting module 206 begins decrementing NR counter, to append skipped periods onto the shortened refresh cycle, when the last refresh address RA of a refresh cycle is identified.

Figure 4:
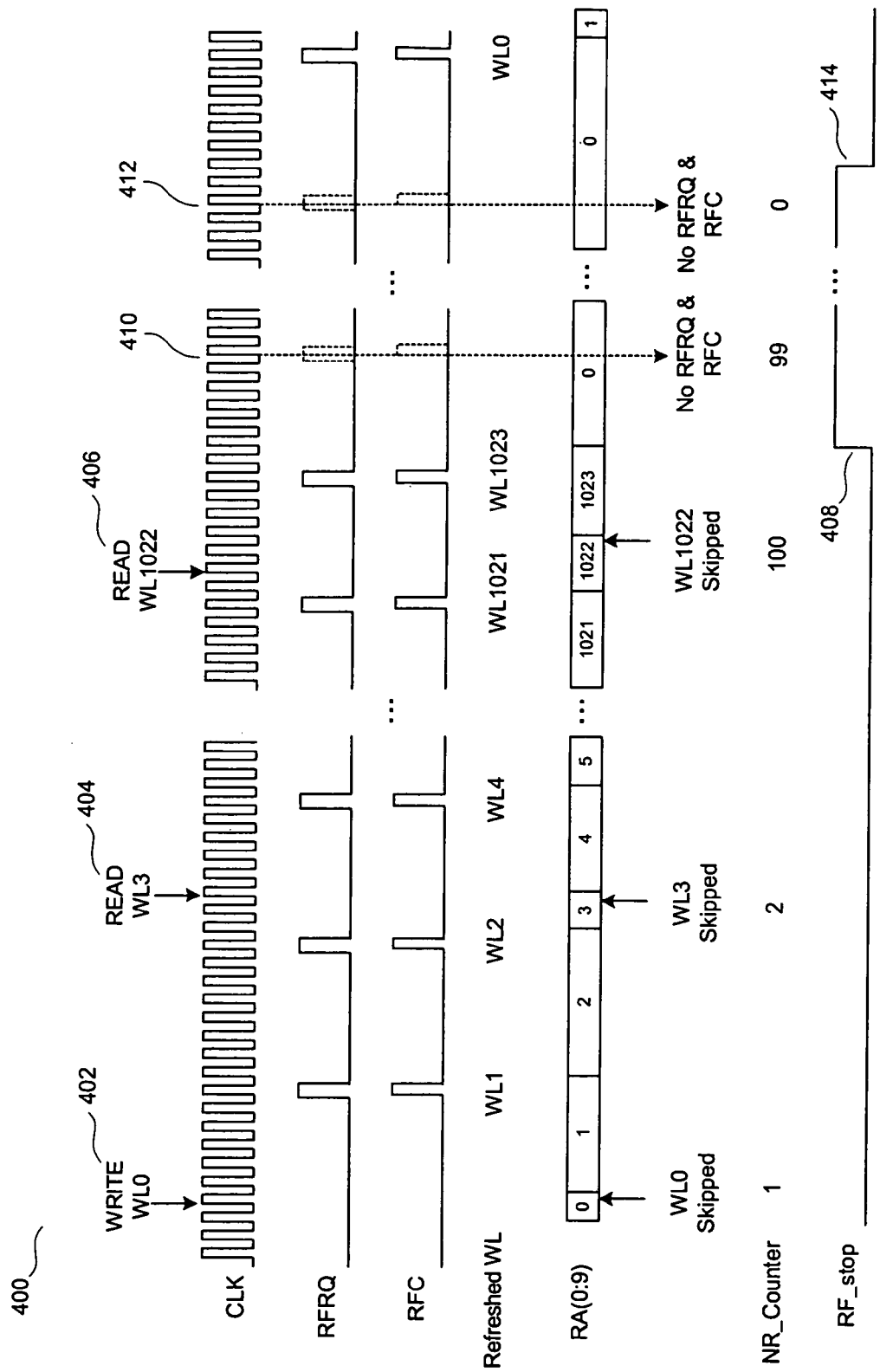
FIG. 4 illustrates a refresh sequence timing diagram for the modified DRAM refresh circuit in accordance with one example of the present disclosure.

FIG. 4 illustrates a refresh sequence timing diagram 400 for the modified DRAM refresh circuit 200 in accordance with one example of the present disclosure. In this example, 100 refreshing operations will be skipped, thereby reducing power consumption. The refresh stop signal RF_stop ensures that 100 non-refreshing periods are appended to the end of the shortened refresh cycle such that the shortened refresh cycle is re-synchronized with the DRAM device refresh cycle.

With reference to FIG. 4, an attempt to refresh the word line 0 coincides with a write command to the word line 0 (location 402). As such, RA equals to A, thereby generating the dummy refresh signal RFCA (RFCA is high), which is used to increment the refresh address counter to the next word line. Therefore, the word line 0 is not refreshed, while the counter NR_counter is incremented from "0" to "1". When the word line 1 is selected for refresh, RA does not equal to A. As such, the periodic refresh request signal RFRQ is generated, thereby generating the refresh command signal RFC and triggering a refreshing operation on the word line 1. The word line 2 is also refreshed in the same manner. At location 404, an attempt to refresh word line 3 coincides with a write command to the same word line. Since RA equals to A, the dummy refresh signal RFCA is generated (RFCA is high) to increment the refresh address counter to the next word line. As such, the word line 3 is not refreshed, while the counter NR_counter is incremented from "1" to "2". After that, the refresh cycle increments to the word line 4, and continues until location 406, when an attempt to refresh the word line 1022 coincides with a read command for the word line 1022. Therefore, the refreshing operation for the word line 1022 is skipped, while the counter NR_counter is incremented from "99" to "100" (meaning that 100 refresh cycles have been skipped). The refresh cycle is then incremented to the word line 1023, which is the last word line in this example with 1024 word lines. When the refresh address counter starts over again at word line 0 (location 408), the refresh stop signal RF_stop is set to high, thereby stopping any further refresh cycles (at location 410, where no RFRQ or RFC signals are generated) until the counter NR_counter has been counted down to "0" again. When the counter NR_counter reaches "0" (at location 412), the refresh stop signal RF_stop deactivates (at location 414) and is set to low, thereby restarting the refresh cycle.

By eliminating unnecessary refreshing operations that may arise after an access operation, power consumption may be reduced. Peak power consumption may also be reduced when many word lines in different memory blocks are refreshed at once. By generating a refresh stop signal, the shortened refresh cycle is synchronized with the maximum refreshing interval for the DRAM device, thereby further ensuring that refreshing operations are performed only when needed.

The above disclosure provides many different embodiments or examples for implementing the different features of the disclosure. Specific examples of components and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. A method for refreshing a memory module comprising:
identifying a beginning of a memory module for a refreshing operation;
identifying at least one address within the memory module being accessed; and
skipping the refreshing operation for the identified accessed memory address, thereby skipping a predetermined number of clock cycles due to the skipped refreshing operation, wherein the skipping the refreshing operation includes the steps of:
comparing a refreshing address with an accessed address; and
if the refreshing address and the accessed address matches, generating a signal for incrementing a refresh counter to a next address.

2. The method of claim 1 wherein the identifying a beginning further includes providing a predetermined external address plus one to a refresh counter.

3. The method of claim 1 wherein the identifying at least one address further includes storing the accessed address in a temporary storage module.

4. The method of claim 1 wherein when the memory module is accessed, it is either accessed by a writing or reading operation.

5. The method of claim 1 wherein the skipping further includes calculating and storing a total number of clock cycles skipped due to the skipped refreshing operation.

6. The method of claim 1 further comprising making up skipped clock cycles before the refreshing operation ends for the memory module.

7. The method of claim 6 wherein the making up further includes blocking further refreshing operation until the skipped clock cycles have been run.

8. A method for refreshing a dynamic memory module comprising:
    identifying a beginning of a memory module for a refreshing operation;
    identifying at least one address within the memory module being written or read;
    skipping the refreshing operation for the identified accessed memory address, thereby skipping a predetermined number of clock cycles due to the skipped refreshing operation; and
    making up skipped clock cycles before the refreshing operation ends for the memory module.

9. The method of claim 8 wherein the identifying a beginning further includes providing a predetermined external address plus one to a refresh counter.

10. The method of claim 8 wherein the identifying at least one address further includes storing the accessed address in a temporary storage module.

11. The method of claim 8 wherein the skipping the refreshing operation further includes:
    comparing a refreshing address with an accessed address; and
    if the refreshing address and the accessed address matches, generating a signal for incrementing a refresh counter to a next address.

12. The method of claim 11 wherein the skipping further includes calculating and storing a total number of clock cycles skipped due to the skipped refreshing operation.

13. The method of claim 12 wherein the making up further includes blocking further refreshing operation until the skipped clock cycles have been run.

14. The method of claim 8 wherein the making up further includes blocking further refreshing operation until the skipped clock cycles have been run.

15. A circuit for refreshing a dynamic memory module comprising:
    means for generating a signal for identifying a beginning of a memory module for a refreshing operation;
    means for storing at least one address within the memory module being written or read;
    means for skipping the refreshing operation for the identified accessed memory address, thereby skipping a predetermined number of clock cycles due to the skipped refreshing operation; and
    means for making up skipped clock cycles before the refreshing operation ends for the memory module.

16. The circuit of claim 15 wherein the means for generating a signal for identifying a beginning further includes an access control module.

17. The circuit of claim 15 wherein the means for storing at least one address further includes a temporary storage module.

18. The circuit of claim 15 wherein the means for skipping the refreshing operation further includes:
    an address comparator for comparing a refreshing address with an accessed address; and
    means for generating a signal for incrementing a refresh counter to a next address if the refreshing address and the accessed address matches.

19. The circuit of claim 15 wherein the means for skipping further includes a counter for calculating and storing a total number of clock cycles skipped due to the skipped refreshing operation.

20. The circuit method of claim 15 wherein the means for making up further includes means for blocking further refreshing operation until the skipped clock cycles have been run.

* * * * *